United States Patent
Ma et al.

(10) Patent No.: US 9,568,564 B2
(45) Date of Patent: Feb. 14, 2017

(54) MAGNETIC NANO-MULTILAYERS FOR MAGNETIC SENSORS AND MANUFACTURING METHOD THEREOF

(75) Inventors: Qinli Ma, Beijing (CN); Houfang Liu, Beijing (CN); Xiufeng Han, Beijing (CN)

(73) Assignee: INSTITUTE OF PHYSICS, CHINESE ACADEMY OF SCIENCES, Haidian District (CN)

( * ) Notice: Subject to any disclaimer, the term of this patent is extended or adjusted under 35 U.S.C. 154(b) by 850 days.

(21) Appl. No.: 13/701,474

(22) PCT Filed: Mar. 4, 2011

(86) PCT No.: PCT/CN2011/000356
§ 371 (c)(1),
(2), (4) Date: Jan. 2, 2013

(87) PCT Pub. No.: WO2011/150665
PCT Pub. Date: Dec. 8, 2011

(65) Prior Publication Data
US 2013/0099780 A1   Apr. 25, 2013

(30) Foreign Application Priority Data

Jun. 1, 2010   (CN) .......................... 2010 1 0195799

(51) Int. Cl.
*G01R 33/02* (2006.01)
*B82Y 25/00* (2011.01)
(Continued)

(52) U.S. Cl.
CPC ............... *G01R 33/02* (2013.01); *B82Y 10/00* (2013.01); *B82Y 25/00* (2013.01); *G01R 33/093* (2013.01);
(Continued)

(58) Field of Classification Search
CPC .. H01L 21/00; H01L 2221/00; H01L 2223/00; H01L 2924/00; H01L 2925/00
(Continued)

(56) References Cited

U.S. PATENT DOCUMENTS

| 7,054,114 | B2 * | 5/2006 | Jander | .................... | B82Y 25/00 |
| | | | | | 360/324.1 |
| 7,092,220 | B2 * | 8/2006 | Gill | ........................ | B82Y 10/00 |
| | | | | | 360/324.11 |

(Continued)

FOREIGN PATENT DOCUMENTS

| CN | 1479874 A | 3/2004 |
| CN | 1655374 A | 8/2005 |

(Continued)

*Primary Examiner* — Jermele M Hollington
*Assistant Examiner* — Temilade Rhodes-Vivour
(74) *Attorney, Agent, or Firm* — Knobbe Martens Olson & Bear LLP (57) ABSTRACT

The invention discloses a magnetic nano-multilayers structure and the method for making it. The multilayer film includes—sequentially from one end to the other end—a substrate, a bottom layer, a magnetic reference layer, a space layer, a magnetic detecting layer and a cap layer. The, up-stated structure is for convert the information of the rotation of the magnetic moment of the magnetic detecting layer into electrical signals. The magnetic detecting layer is of a pinning structure to react to the magnetic field under detection. On the other hand, the invention sandwiches an intervening layer between the AFM and the FM to mitigate the pinning effect from the exchange bias. Moreover, the thickness of the intervening layer is adjustable to control the pinning effect from the exchange bias. The controllability ensures that the magnetic moments of the magnetic reference layer and the magnetic detecting layer remain at right angles to each other when the external field is zero. The invention achieves a GMR or TMR magnetic sensor exhib- (Continued)

iting a linear response and by tuning the thickness of the non-magnetic metallic layer, the sensitivity as well as the detecting range of the devices can be tuned easily.

24 Claims, 4 Drawing Sheets

(51) Int. Cl.
    *G01R 33/09*     (2006.01)
    *G11B 5/39*     (2006.01)
    *H01L 43/08*     (2006.01)
    *G11C 11/16*     (2006.01)
    *B82Y 10/00*     (2011.01)
    *H01L 21/00*     (2006.01)

(52) U.S. Cl.
    CPC .......... *G01R 33/098* (2013.01); *G11B 5/3906* (2013.01); *G11B 5/3909* (2013.01); *G11C 11/16* (2013.01); *G11C 11/161* (2013.01); *H01L 43/08* (2013.01); *G11B 2005/3996* (2013.01); *H01L 21/00* (2013.01); *H01L 2221/00* (2013.01); *H01L 2223/00* (2013.01); *Y10S 977/70* (2013.01)

(58) Field of Classification Search
    USPC ......................................................... 324/414
    See application file for complete search history.

(56) References Cited

U.S. PATENT DOCUMENTS

| | | | | |
|---|---|---|---|---|
| 7,099,123 | B2* | 8/2006 | Gill | G11B 5/3932 360/324.12 |
| 2002/0008234 | A1* | 1/2002 | Emrick | C23C 16/26 257/43 |
| 2002/0154456 | A1* | 10/2002 | Carey | B82Y 10/00 360/324.11 |
| 2004/0233565 | A1* | 11/2004 | Arai | G11B 5/667 360/66 |
| 2005/0180202 | A1 | 8/2005 | Huai et al. | |
| 2006/0102969 | A1 | 5/2006 | Huai et al. | |
| 2007/0264422 | A1* | 11/2007 | Zimmer | 427/127 |
| 2008/0043519 | A1* | 2/2008 | Kitagawa | G11C 11/16 365/158 |
| 2009/0059656 | A1* | 3/2009 | Kanakasabapathy | H01L 23/544 365/158 |
| 2011/0008915 | A1* | 1/2011 | Nozieres | G11C 11/16 438/3 |
| 2011/0014500 | A1* | 1/2011 | Horng | C23C 14/3414 428/846.3 |

FOREIGN PATENT DOCUMENTS

| | | |
|---|---|---|
| CN | 1836896 A | 9/2006 |
| CN | 1960018 | 5/2007 |

* cited by examiner

Structure A

Fig. 3

Structure B

Fig. 4

Structure C

Fig. 5

Structure D

Fig. 6

Structure E

MAGNETIC NANO-MULTILAYERS FOR MAGNETIC SENSORS AND MANUFACTURING METHOD THEREOF

BACKGROUND OF THE INVENTION

The present invention generally relates to spintronics materials and magnetic sensors. More specifically, the invention relates to magnetic nano-multilayers for magnetic sensors and the manufacturing method thereof.

The magnetic sensors are extensively applied in several areas such as the data storage, mechanical positioning, speed measuring and non-destructive detection. The magnetic sensors are primarily made of semiconductor materials exhibiting the Hall effect and the magnetic materials possessing anisotropic magnetoresistance (AMR). Both materials suffer from an inadequacy of sensitivity to magnetic fields. As the spintronics developed since 1988, the magnetic sensors built upon giant magnetorsistance [GMR] effect and tunnel magnetoresistance [TMR] have gained wider attention. Magnetic sensors based on spintronics materials have become popular for two reasons. One reason is that they are more sensitive. The other reason is that the techniques for making devices implementing the GMR and the TMR effect are compatible with those for making stable semiconductor products. Thus, the magnetic sensors promise a huge demand because of their extensive industrial applications.

The present technique in the industry for manufacturing GMR and TMR magnetic sensors (e.g. the magnetic read head in a hard disk drive [HDD]) involves essentially an embedded permanent magnetic film. The presence of the permanent magnetic film makes sure that the magnetic moment of the free layer in spin value structure—the layer sensitive to external magnetic field—and that of the reference layer—the pinned layer—stay at right angles. In turn, the magnetoresistance of a nano-structured magnetic multilayer or magnetic tunnel junction [MTJ] responds linearly to the applied field, and free from magnetic hysteresis. Unfortunately, to embed a permanent magnetic film in the GMR spin value structure and in the MTJ hugely drives up the complexity and the cost for producing the devices. Moreover, the devices made with the present art are not as compact as we want them to be.

BRIEF SUMMARY OF THE INVENTION

The invention discloses a magnetic nano-multilayers for magnetic sensors comprising, in sequence from bottom: a substrate; a bottom layer; a magnetic reference layer; a space layer; a magnetic detecting layer; and a cap layer, wherein: the magnetic reference layer is of a direct or indirect pinning structure, and the magnetic detecting layer is of an indirect pinning structure. The up-stated structure is used to convert the information about the rotation of the magnetic moment of the magnetic detecting layer into an electrical signal, and the magnetic detecting layer is of the pinning structure for detecting the magnetic field under detection.

As an improvement, the invention discloses the magnetic nano-multilayers as previously described, wherein the pinning structure is an indirect pinning structure, said indirect pinning structure comprising one of: an antiferromagnetic layer (AFM)/a nonmagnetic layer (NM)/a ferromagnetic layer (FM); and an antiferromagnetic layer (AFM)/a first nonmagnetic metallic layer (NM1)/a first ferromagnetic layer (FM1)/a second nonmagnetic metallic layer (NM2)/a second ferromagnetic layer (FM2).

As an improvement, the invention discloses the magnetic nano-multilayers as previously described, wherein said direct pinning structure comprising an antiferromagnetic layer (AFM)/a ferromagnetic layer (FM), or an antiferromagnetic layer (AFM)/a first ferromagnetic layer (FM1)/a nonmagnetic layer (NM)/a second ferromagnetic layer (FM2).

As an improvement, the invention discloses the magnetic nano-multilayers as previously described, wherein the strength of exchange-bias in the antiferromagnetic layer of the magnetic detecting layer is less than that of the antiferromagnetic layer of the magnetic reference layer.

As an improvement, the invention discloses the magnetic nano-multilayers as previously described, wherein the Block temperature in the antiferromagnetic layer of the magnetic detecting layer is less than that of the antiferromagnetic layer of the magnetic reference layer when the magnetic detecting layer and magnetic reference layers are of the indirect pinning structure.

As an improvement, the invention discloses the magnetic nano-multilayers as previously described, wherein the antiferromagnetic layer in the magnetic detecting layer and the magnetic reference layer are made of different antiferromagnetic materials or a same antiferromagnetic material but of different thicknesses.

As an improvement, the invention discloses the magnetic nano-multilayers as previously described, wherein the antiferromagnetic material includes one of antiferromagnetic alloy and antiferromagnetic oxide.

As an improvement, the invention discloses the magnetic nano-multilayers as previously described, wherein: the ferromagnetic layer (FM), the first ferromagnetic layer (FM1) and the second ferromagnetic layer (FM2) are made of ferromagnetic metals, or an alloy of ferromagnetic metals and have a thickness of from 1 to 20 nm; or diluted magnetic semiconductors or semi-metallic materials and have a thickness of from 2.0 to 50 nm; and
the ferromagnetic layer is a single layer film, or a composite film made of multilayers.

As an improvement, the invention discloses the magnetic nano-multilayers as previously described, wherein the space layer includes one of a nonmagnetic metallic layer and an insulating barrier layer.

As an improvement, the invention discloses the magnetic nano-multilayers as previously described, wherein the bottom layer is one of a single nonmagnetic metallic layer and a nonmagnetic metallic multilayers, and has a thickness from 3 to 50 nm.

As an improvement, the invention discloses the magnetic nano-multilayers as previously described wherein the cap layer is one of a single-layer metallic film and a multilayer metallic film and has a thickness from 2 to 40 nm.

The invention further discloses a method of making a magnetic nano-multilayers, comprising the steps of: 1) providing a substrate; 2) forming a multilayer on the substrate, the multilayer comprising, in sequence from bottom: a bottom layer, a magnetic reference layer, a space layer, a magnetic detecting layer, a magnetic detecting layer, and a cap layer; 3) subjecting the multilayer deposit to a first vacuum annealing in a first magnetic field; and 4) subjecting the multilayer deposit to a second vacuum annealing in a second magnetic field, wherein: the temperature of the first vacuum annealing is greater than the Block temperature $T_B 1$ in an antiferromagnetic layer of the magnetic reference layer; the temperature of the second vacuum annealing is lower than the Block temperature $T_B 1$ in the antiferromagnetic layer of the magnetic reference layer and greater than the Block temperature $T_B2$ in the antiferromagnetic layer of the magnetic detecting layer; and the direction of the magnetic field of the first annealing is perpendicular to that of the magnetic field of the second annealing.

As an improvement, the invention discloses the method as previously described, wherein in above step 2) the magnetic reference layer is formed by one of the steps of: depositing an antiferromagnetic layer (AFM), a first ferromagnetic layer (FM1) on top of the antiferromagnetic layer, a nonmagnetic metallic layer (NM) on top of the first ferromagnetic layer and a second ferromagnetic layer (FM2) on top of the nonmagnetic metallic layer; and depositing an antiferromagnetic layer (AFM), a nonmagnetic metallic layer (NM) on top of the antiferromagnetic layer, and a ferromagnetic layer (FM) on top of the nonmagnetic metallic layer.

The invention further discloses a magnetic sensor, comprising: a magnetic field under detection; and a magnetic resistor unit including a magnetic nano-multilayers, wherein the magnetic nano-multilayers comprises, in sequence from bottom: a substrate; a bottom layer; a magnetic reference layer; a space layer; a magnetic detecting layer; and a cap layer, wherein: the magnetic reference layer is of a direct or indirect pinning structure, and the magnetic detecting layer is of an indirect pinning structure for converting the information about the rotation of the magnetic moment of the magnetic detecting layer into electrical signal and detecting a magnetic field under detection; and the direction of magnetic moment of the magnetic reference layer is perpendicular to that of the magnetic detecting layer when the magnetic field under detection is zero.

As an improvement, the invention discloses the magnetic sensor as previously described, wherein, when external magnetic field is zero: the direction of the magnetic moment of the magnetic reference layer is parallel to that of the magnetic field under detection; and the direction of the magnetic moment of the magnetic detecting layer is perpendicular to that of the magnetic field under detection.

As an improvement, the invention discloses the magnetic sensor as previously described, wherein the pinning structure is an indirect pinning structure, said indirect pinning structure comprising one of: an antiferromagnetic layer (AFM)/a nonmagnetic metallic layer (NM)/a ferromagnetic layer (FM); and an antiferromagnetic layer (AFM)/a first nonmagnetic metallic layer (NM1)/a first ferromagnetic layer (FM1)/a second nonmagnetic metallic layer (NM2)/a second ferromagnetic layer (FM2).

As an improvement, the invention discloses the magnetic sensor as previously described, wherein the pining structure is a direct pinning structure, said direct pinning structure comprising an antiferromagnetic layer (AFM)/a ferromagnetic layer (FM), or an antiferromagnetic layer (AFM)/a first ferromagnetic layer (FM1)/a nonmagnetic metallic layer (NM)/a second ferromagnetic layer (FM2).

As an improvement, the invention discloses the magnetic sensor as previously described, wherein the strength of exchange-bias in the antiferromagnetic layer of the magnetic detecting layer is less than that of the antiferromagnetic layer of the magnetic reference layer.

As an improvement, the invention discloses the magnetic sensor as previously described, wherein the Block temperature in the antiferromagnetic layer of the magnetic detecting layer is less than that of the antiferromagnetic layer of the magnetic reference layer when the magnetic detecting layer and magnetic reference layer are of the indirect pinning structure.

Comparing with the prior art, the advantages of the present invention lie in:
1) The manufacturing process is simplified and the manufacturing cost is reduced.
2) It facilitates further miniaturization of the device unit, micro-machining and integration, and the two post-annealing in a first magnetic field can be implemented easily with relatively low process difficulty.
3) the sensitivity and linear operation region can be changed continuously by adjusting the thickness of super thin nonmagnetic metallic layer.

DETAILED DESCRIPTION OF THE INVENTION

Figure 1:
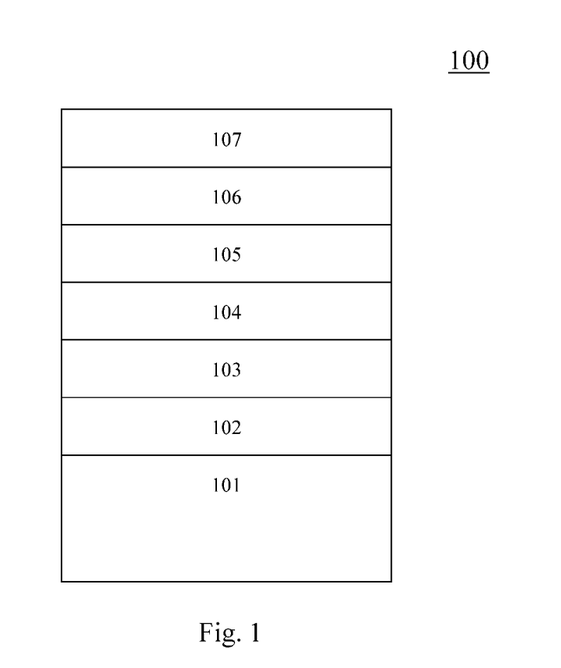
FIG. 1 is a schematic diagram of the magnetic nano-multilayers of the present invention.

FIG. 1 is an embodiment of the magnetic nano-multilayers 100 of the present invention, which, sequentially from the bottom to the top, includes: a substrate 101 [hereinafter "SUB"], a seed layer 102 [hereinafter "SL"], a magnetic reference layer 103, a space layer 104 [hereinafter "Space"], a magnetic detecting layer 105 and a magnetic reference layer 106 [hereinafter "CAP"], wherein the magnetic moment of the magnetic detecting layer 105 is perpendicular to that of the magnetic reference layer 103 when the external magnetic field is zero. Notably, the magnetic reference layer of the present invention refers to the functional magnetic layer for converting the information regarding the rotation of the magnetic moment in the magnetic detecting layer to electrical signals. The magnetic moment of the magnetic reference layer under a zero field is parallel to that of the magnetic field under detection. Next, the magnetic detecting layer refers to the functional magnetic layer for inducing external magnetic fields. The magnetic moment of the magnetic detecting layer under a zero field is perpendicular to that of the magnetic under detection. A detailed description of each layer is now in order.

The substrate 101 is one of Si, SiC, glass, Si—SiO$_2$ and organic flexible substrate, with a thickness ranges from 0.3 to 1 mm.

The seed layer (a.k.a. bottom layer) 102 is nonmagnetic metal layer (single layer or multilayer) with greater conductivity and with tighter adhesion to the substrate. Preferably, the seed layer is one of Ta, Ru, Cr, Au, Ag, Pt, Pd, Cu, CuN, etc. Alternatively, the seed layer is a hybridized layer of metal and antiferromagnetic layer. The thickness of the seed layer ranges from 3 to 50 nm.

The space layer 104 is a nonmagnetic metal layer or an insulating barrier layer. When the space layer is a nonmagnetic metal layer, the magnetic nano-multilayer thus formed is a multilayer structure for use with GMR devices. The nonmagnetic metal layer typically is one of Cu, Cr, V, Nb, Mo, Ru, Pd, Ta, W, Pt, Ag, Au and an alloy of such metals. The thickness of the nonmagnetic layer ranges from 1 to 5 nm. When the space layer is a barrier layer, the magnetic nano-multilayer is a structure for use with TMR devices. The barrier layer typically is one of $AlO_x$, MgO, $Mg_{1-x}Zn_{nx}O$, AlN, $Ta_2O_5$, ZnO, $HfO_2$, $TiO_2$, $Alq_3$, LB organic hybridized film, GaAs, AlGaAs and InA. Preferably, the barrier layer is one of MgO, $AlO_x$, MgZnO, AlN, $Alq_3$, LB organic hybridized film, and the thickness of the barrier generally ranges from 0.5 to 5 nm.

The cap layer 106 is a metal layer—including single layer and/or multilayer hybridized metal layer—which is not prone to oxidization and has better conductivity. Preferably, the cap layer is one of Ta, Cu, Al, Ru, Au, Ag, Pt, etc. The cap layer, which shields the core structure from oxidization and corrosion, preferably has a thickness ranging from 2 to 40 nm.

The structure of the magnetic reference layer 103 and of the magnetic detecting layer 105 is one of direct pinning structure and indirect pinning structure. Direct pinning refers to the situation where the antiferromagnetic layer [AFM] directly contacts the ferromagnetic layer [FM] (AFM/FM). Indirect pinning structure refers to one of the situations where: an extremely thin layer nonmagnetic metal layer is sandwiched between the antiferromagnetic layer [AFM] and the ferromagnetic layer [FM] (FM/NM/AFM); a hybridized layer [NM/FM] is sandwiched between the antiferromagnetic layer [AFM] and the ferromagnetic layer [FM] (FM1/NM/FM2/AFM); and, a hybridized layer [NM/FM/NM] is sandwiched between the antiferromagnetic layer [AFM] and the ferromagnetic layer [FM] (FM1/NM1/FM2/NM2/AFM). The addition of an intervening layer between the AFM and the FM mitigates the pinning effect (i.e. direct exchange bias) arising there between. Also, indirect exchange bias is effectively controlled by manipulating the thickness of the intervening layer.

In the magnetic reference layer 103 and the magnetic detecting layer 105, the antiferromagnetic layer [AFM] includes antiferromagnetic alloy, and, preferably, one of Pt—Mn, Ir—Mn, Fe—Mn and Ni—Mn, and the thickness preferably ranges from 5 to 50 nm. Alternatively, the AFM is an antiferromagnetic oxide, and preferably, includes one of CoO and NiO, and the thickness preferably ranges from 5 to 50 nm. The ferromagnetic layer [FM] is a ferromagnetic metal with a greater rate of self-rotating polarization and, preferably, includes Co, Fe or Ni. Alternatively, the FM is a film of an alloy including said ferromagnetic metals and, preferably, is a ferromagnetic alloy including one of Co—Fe, Co—Fe—B, NiFeCr and Ni—Fe (e.g. $Ni_{81}Fe_{19}$), and the thickness preferably ranges from 1 to 20 nm. Alternatively, the AFM is a diluted magnetic semiconductor material such as GaMnAs and Ga—Mn—N or is a semi-metallic material such as Co—Mn—Si, Co—Fe—Al, Co—Fe—Si, Co—Mn—Al, Co—Fe—Al—Si, Co—Mn—Ge, Co—Mn—Ga, Co—Mn—Ge—Ga, $La_{1-x}S_{rx}MnO_3$ and $La_{1-x}Ca_xMnO_3$ (where $0<x<1$) with the thickness ranging from 2.0 to 50 nm. The ferromagnetic layer is a unitary single layer or a hybridized film comprising of various materials. The extremely thin nonmagnetic metal layer between the FM and the AFM typically is one of Cu, Cr, V, Nb, Mo, Ru, Pd, Ta, W, Pt, Ag, Au and alloy thereof. The thickness of the nonmagnetic metal layer ranges from 0.1 to 5 nm.

Figure 3:
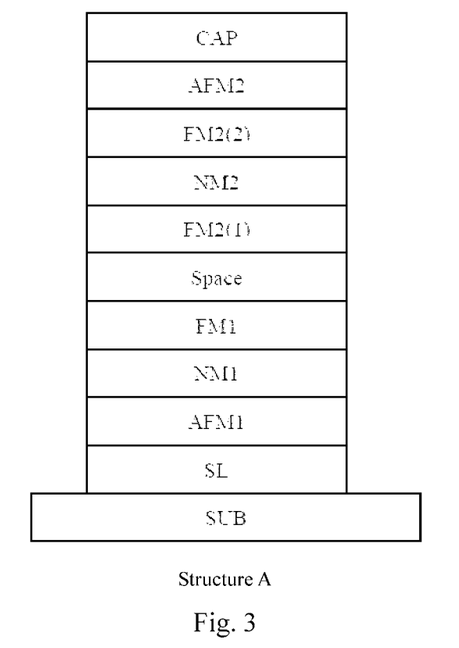
FIG. 3 is a schematic diagram exhibiting the structure A of the magnetic multilayer film in examples 1 through 5 of the present invention.
Figure 4:
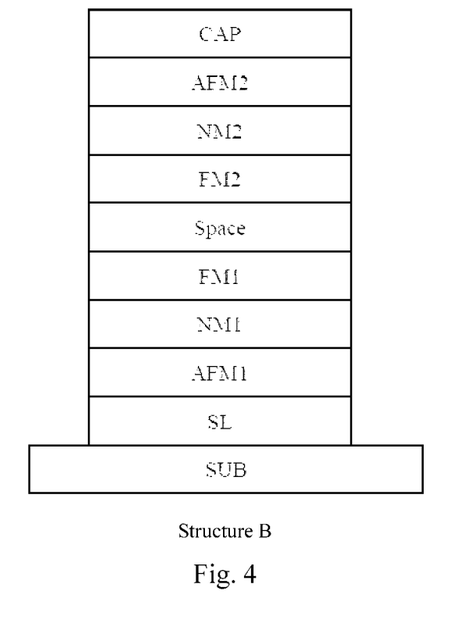
FIG. 4 is a schematic diagram exhibiting the structure B of the magnetic multilayer film in examples 6 through 10 of the present invention.
Figure 5:
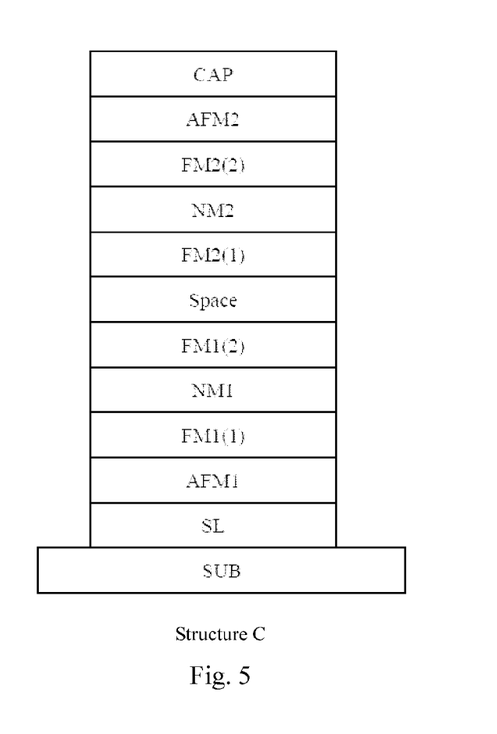
FIG. 5 is a schematic diagram exhibiting the structure C of the magnetic multilayer film in examples 11 through 15 of the present invention.

The example structures of the magnetic nano-multilayers of the present invention embodies include, but are not limited to:

Structure A: SUB/SL/AFM1/NM1/FM1/Space/FM2(1)/NM2/FM2(2)/AFM2/CAP;

Structure B: SUB/SL/AFM1/NM1/FM1/Space/FM2/NM2/AFM2/CAP;

Structure C: SUB/SL/AFM1/FM1(1)/NM1/FM1(2)/Space/FM2(1)/NM2/FM2 (2)/AFM2/CAP.

As the thickness of the NM1 increases, the FM1(1)/NM1/FM1(2) may vary from antiferromagnetic coupling to ferromagnetic coupling; moreover, the coupling intensity may decrease.

Figure 6:
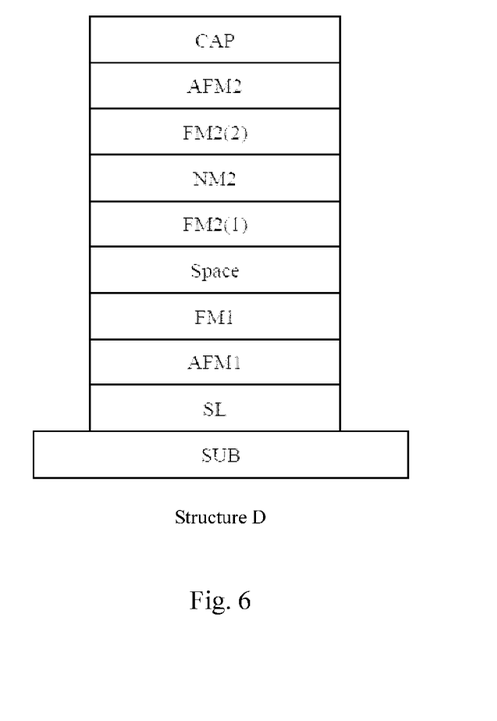
FIG. 6 is a schematic diagram exhibiting the structure D of the magnetic multilayer film in examples 16 through 20 of the present invention.

Structure D: SUB/SL/AFM1/FM1/Space/FM2(1)/NM/FM2(2)/AFM2/CAP, wherein (1) & (2) denote that the two FM2 layers can be of the same material though of different thicknesses.

Figure 7:
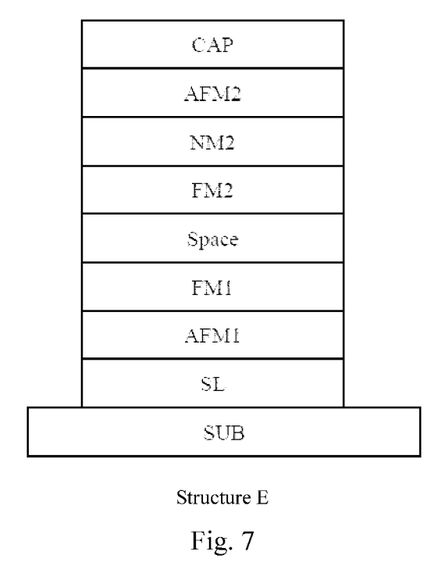
FIG. 7 is a schematic diagram exhibiting the structure E of the magnetic multilayer film in examples 21 through 26 of the present invention.

Structure E: SUB/SL/AFM1/FM1/Space/FM2/NM/AFM2/CAP;

Preferably, the strength of exchange-bias of the antiferromagnetic layer in the magnetic detecting layer is less than that of the antiferromagnetic layer in the magnetic reference layer. When the magnetic moment of the detecting layer rotates under the external magnetic field, the devices out-put will be a linear conductance as a function of the magnetic field. When both the magnetic detecting layer and the magnetic reference layer are of the indirect pinning structure, wherein the Block temperature in the antiferromagnetic layer of the magnetic detecting layer is less than that of the antiferromagnetic layer of the magnetic reference layer. In other words, when the magnetic reference layer 103 and the magnetic detecting layer 105 are of the same material, the antiferromagnetic layer in the magnetic reference layer should generally be thicker than that in the magnetic detecting layer. The difference in thickness makes the Block temperature different.

Figure 2:
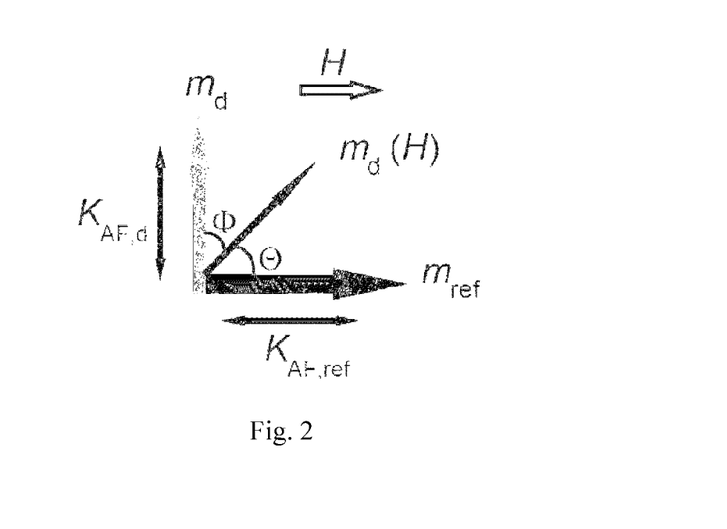
FIG. 2 is a schematic diagram exhibiting the distribution of the magnetic moments in the magnetic reference layer and in the magnetic detecting layer of the magnetic nano-multilayers of the present invention.

FIG. 2 is a schematic diagram showing the distribution of the magnetic moment in the magnetic reference layer and the magnetic detecting layer of the magnetic nano-multilayers which exhibits the property of linear magnetoresistance. Assuming the direction of the external magnetic field H is as what the figure shows, when H equals to zero, the magnetic moment of the magnetic reference layer $m_{ref}$ and H are of the same direction; and the magnetic moment of the magnetic detecting layer $m_d$ is perpendicular to H (i.e. $m_{ref}$). When the external magnetic field does not equal to zero, the magnetic moment of the magnetic detecting layer $m_d$ rotates by an angle φ until it is aligned with $m_d$(H). The rotation alters the angle between the magnetic moment of the magnetic reference layer and that of the magnetic detecting layer from 90 to θ in response to the variation of the external magnetic field H. $K_{AF,d}$ stands for the pinning direction of the antiferromagnetic layer of the magnetic detecting layer in relation to the magnetic moment of the magnetic detecting layer. $K_{AF,ref}$ stands for the pinning direction of the antiferromagnetic layer of the magnetic reference layer in relation to magnetic moment of the magnetic reference layer.

Because the magnetic nano-multilayers of the present invention realizes the perpendicular pinning of the two artificially combined antiferromagnetic layers which sit 90 degrees across each other, the device of the invention embodies exhibits the property of linear magnetic resistance, which obviates an embedding of the permanent magnetic film otherwise necessary when in use.

An embodiment of a method of the present invention for making said magnetic nano-multilayers comprises the following steps:

1) Providing a substrate 101. Applying usual techniques such as magnetron sputtering deposition and pulsed laser deposition, a bottom layer 102, a magnetic reference layer 103, a space layer 104, a magnetic detecting layer 105, and a cap layer 106 are sequentially deposited upon the substrate 101.

2) Subjecting the multilayer obtained from step 1) deposit to a first vacuum annealing in a first magnetic field. The temperature of the first vacuum annealing $T_1$ is greater than the Block temperature in an antiferromagnetic layer of the magnetic reference layer $T_{B.rdf}$.

3) Subjecting the multilayer obtained from step 2) deposit to a second vacuum annealing in a second magnetic field. The temperature of the second vacuum annealing is less than the Block temperature in the antiferromagnetic layer of the magnetic reference layer $T_{B.rdf}$ and greater than the Block temperature in the antiferromagnetic layer of the magnetic detecting layer $T_{B.d}$. Moreover, the direction of the first magnetic field is perpendicular to that of the second magnetic field.

A few examples of making the magnetic nano-multilayers applying the embodiments of the methods of the present invention are in order.

Examples 1~5

Refer to FIG. 3. The compositions and thicknesses of the layers in examples 1~5 applying the structure A (SUB/SL/AFM1/NM1/FM1/Space/FM2(1)/NM2/FM2(2)/AFM2/CAP) are shown in table 1. Example 1 illustrates the way the magnetic nano-multilayers of structure A are made. The steps include:

1) Providing a substrate (SUB). The substrate is made of a piece of Si—SiO$_2$ with a thickness of 1 mm. Also, depositing a seed layer Ta (5 nm)/Ru (20 nm)/Ta (5 nm) on the substrate with a magnetron sputtering deposition device under the following conditions: a vacuum better than 2×10$^{-6}$ Pa, a deposition rate of 0.1 nm/s and an argon gas pressure of 0.07 Pa during deposition.

2) Depositing on the seed layer (SL) a layer of PtMn with the thickness of 15 nm, which is the first antiferromagnetic layer (AF1), under the following conditions: a vacuum better than 2×10$^{-6}$ Pa, a deposition rate of 0.1 nm/s and an argon gas pressure of 0.07 Pa.

3) Depositing on the AF1 a layer of Cu with the thickness of 0.5 nm, which is the NM1 layer, under the following conditions: a vacuum better than 2×10$^{-6}$ Pa, a deposition rate of 0.1 nm/s and an argon gas pressure of 0.07 Pa.

4) Depositing on the NM1 a layer of CoFeB with the thickness of 3 nm, which is the first ferromagnetic layer (FM1), under the following conditions: a vacuum better than 2×10$^{-6}$ Pa, a deposition rate of 0.06 nm/s and an argon gas pressure of 0.07 Pa.

5) Depositing on the FM1 a layer of MgO with the thickness of 2 nm, which is the space layer, under the following conditions: a vacuum better than 2×10$^{-6}$ Pa, a deposition rate of 0.07 nm/s and an argon gas pressure of 0.07 Pa.

6) Depositing on the space layer a layer of CoFeB with the thickness of 4 nm, which is the FM2(1) layer, under the following conditions: a vacuum better than 2×10$^{-6}$ Pa, a deposition rate of 0.06 nm/s and an argon gas pressure of 0.07 Pa.

7) Depositing on the FM2(1) an ultrathin non-magnetic metal layer of Ru with the thickness of 0.85 nm, which is the NM2 layer, under the following conditions: a vacuum better than 2×10$^{-6}$ Pa, a deposition rate of 0.1 nm/s and an argon gas pressure of 0.07 Pa.

8) Depositing on the NM2 a layer of CoFe with the thickness of 2.5 nm, which is the FM2(2) layer, under the following conditions: a vacuum better than 2×10$^{-6}$ Pa, a deposition rate of 0.06 nm/s and an argon gas pressure of 0.07 Pa.

9) Depositing on the FM2(2) a layer of PtMn with the thickness of 7 nm, which is the AFM2 layer, under the following conditions: a vacuum better than 2×10$^{-6}$ Pa, a deposition rate of 0.1 nm/s and an argon gas pressure of 0.07 Pa.

10) Depositing on the AFM2 a layer of Ta (5 nm)/Ru (5 nm), which is the cap layer, under the following conditions: a vacuum better than 2×10$^{-6}$ Pa, a deposition rate of 0.1 nm/s and an argon gas pressure of 0.07 Pa.

11) Causing the film obtained in step 10) to undergo a vacuum of 2×10$^{-4}$ Pa and a magnetic field in the annealing furnace. The magnetic field is aligned to a specific direction of the film. Drop the temperature after it stays for one hour at 375° C.

12) Causing the film obtained in step 11) to undergo a vacuum of 2×10$^{-4}$ Pa and a magnetic field in the annealing oven. The magnetic field in this step is perpendicular to that in step 11) and is aligned to the plane defined by the film. Drop the temperature after it stays for 15 minutes at 250° C. The film thus obtained is the magnetic nano multilayer, we need.

The magnetic nano-multilayers are prepared in the form of a solid disk with a diameter of 10 μm after subsequent micro machining. The magnetic multilayer film structure can be used as a core detecting unit for a TMR magnetic sensor.

TABLE 1

| Example # | | 1 | 2 | 3 | 4 | 5 |
|---|---|---|---|---|---|---|
| SUB | composition | Si—SiO$_2$ | Si—SiO$_2$ | Si—SiO$_2$ | Si—SiO$_2$ | Si—SiO$_2$ |
| | thickness | 1 mm | 1 mm | 1 mm | 1 mm | 1 mm |
| SL | composition | Ta/Ru/Ta | Ru | Ru/Cu/Ru | Ta | Ta/Ru/Ta |
| | thickness | 5/20/5 | 5 | 5/20/5 | 30 | 5/20/5 |
| AFM1 | composition | PtMn | IrMn | PtMn | PtMn | IrMn |
| | thickness | 15 | 15 | 15 | 15 | 15 |
| NM1 | composition | Cu | Ru | Ru | Ru | Cu |
| | thickness | 0.5 | 0.2 | 1 | 1.1 | 0.5 |
| FM1 | composition | CoFe | Co | CoFeB | CoFe | Co |
| | thickness | 3 | 3 | 3 | 4 | 2.5 |

TABLE 1-continued

| Example # | | 1 | 2 | 3 | 4 | 5 |
|---|---|---|---|---|---|---|
| Space | composition | Cu | Cu | MgO | $AlO_x$ | MgZnO |
| | thickness | 2.8 nm | 2.0 nm | 1.5 nm | 1.0 nm | 2.0 nm |
| FM2 (1) | composition | CoFe | Co | CoFeB | CoFe | CoFeB |
| | thickness | 4.0 nm | 3 | 4.0 nm | 4.0 nm | 3 |
| NM2 | composition | Ru | Ru | Ru | Ru | Cu |
| | thickness | 0.85 | 1.2 | 0.8 | 0.9 | 0.8 |
| FM2 (2) | composition | CoFe | CoFe | CoFe | CoFe | CoFe |
| | thickness | 2.5 | 3 | 3.5 | 3.5 | 3 |
| AFM2 | composition | PtMn | IrMn | IrMn | IrMn | IrMn |
| | thickness | 7 | 7 | 12 | 12 | 7 |
| CAP | composition | Ta/Ru | Cu | Ru | Cu | Ag |
| | thickness | 5/5 | 20 | 10 | 20 | 5 |

(Thicknesses are measured in nano meters unless otherwise indicated.)

Examples 6~10

Examples 6~10 are made according to the method with which the example 1 is made. What the examples 6~10 differ from the example 1 is that the magnetic nano-multilayers of the former is of the structure B, i.e. SUB/SL/AFM1/NM1/FM1/Space/FM2/NM2/AFM2/CA, as shown in FIG. 4. The composition and the thickness of each layer are shown in table 2.

TABLE 2

| Example # | | 6 | 7 | 8 | 9 | 10 |
|---|---|---|---|---|---|---|
| SUB | composition | Si—$SiO_2$ | Si—$SiO_2$ | Si—$SiO_2$ | Si—$SiO_2$ | Si—$SiO_2$ |
| | thickness | 1 mm | 1 mm | 1 mm | 1 mm | 1 mm |
| SL | composition | Ta/Ru/Ta | Ru | Ru/Cu/Ru | Ta | Ta/Ru/Ta |
| | thickness | 5/20/5 | 5 | 5/20/5 | 30 | 5/20/5 |
| AFM1 | composition | PtMn | IrMn | PtMn | PtMn | IrMn |
| | thickness | 15 | 15 | 15 | 15 | 15 |
| NM1 | composition | Cu | Ru | Ru | Ru | Cu |
| | thickness | 0.5 | 0.2 | 1 | 1.1 | 0.5 |
| FM1 | composition | CoFe | Co | CoFeB | CoFe | Co |
| | thickness | 3 | 3 | 3 | 4 | 2.5 |
| Space | composition | Cu | Cu | MgO | $AlO_x$ | MgZnO |
| | thickness | 2.8 nm | 2.0 nm | 1.5 nm | 1.0 nm | 2.0 nm |
| FM2 | composition | CoFe | Co | CoFeB | CoFe | CoFeB |
| | thickness | 4.0 nm | 3 | 4.0 nm | 4.0 nm | 3 |
| NM2 | composition | Ru | Ru | Ru | Ru | Cu |
| | thickness | 0.85 | 1.2 | 0.8 | 0.9 | 0.8 |
| AFM2 | composition | PtMn | IrMn | IrMn | IrMn | IrMn |
| | thickness | 7 | 7 | 12 | 12 | 7 |
| CAP | composition | Ta/Ru | Cu | Ru | Cu | Ag |
| | thickness | 5/5 | 20 | 10 | 20 | 5 |

(Thicknesses are measured in nano meters unless otherwise indicated.)

Examples 11~15

Examples 11~15 are made according to the method with which the example 1 is made. What the examples 11~15 differ from the example 1 is that the magnetic nano-multilayers of the former is of the structure C, i.e. SUB/SL/AFM1/FM1(1)/NM1/FM1(2)/Space/FM2(1)/NM2/FM2(2)/AFM2/CAP, as shown in FIG. 5. The composition and the thickness of each layer are shown in table 3.

TABLE 3

| Examples # | | 11 | 12 | 13 | 14 | 15 |
|---|---|---|---|---|---|---|
| SUB | composition | Si—$SiO_2$ | Si—$SiO_2$ | Si—$SiO_2$ | Si—$SiO_2$ | Si—$SiO_2$ |
| | thickness | 1 mm | 1 mm | 1 mm | 1 mm | 1 mm |
| SL | composition | Ta/Ru/Ta | Ru | Ru/Cu/Ru | Ta | Ta/Ru/Ta |
| | thickness | 5/20/5 | 5 | 5/20/5 | 30 | 5/20/5 |
| AFM1 | composition | PtMn | IrMn | PtMn | PtMn | IrMn |
| | thickness | 15 | 15 | 15 | 15 | 15 |
| FM1 (1) | composition | CoFe | CoFe | CoFe | CoFe | CoFe |
| | thickness | 3 | 3 | 2.5 | 0.5 | 0.6 |
| NM1 | composition | RU | RU | RU | RU | CU |
| | thickness | 0.9 | 0.9 | 1 | 1.1 | 0.5 |

TABLE 3-continued

| Examples # | | 11 | 12 | 13 | 14 | 15 |
|---|---|---|---|---|---|---|
| FM2 (1) | composition | CoFe | Co | CoFeB | CoFe | Co |
| | thickness | 3 | 3 | 3 | 4 | 2.5 |
| Space | composition | Cu | Cu | MgO | $AlO_x$ | MgZnO |
| | thickness | 2.8 nm | 2.0 nm | 1.5 nm | 1.0 nm | 2.0 nm |
| FM2 (1) | composition | CoFe | Co | CoFeB | CoFe | CoFeB |
| | thickness | 4.0 nm | 3 | 4.0 nm | 4.0 nm | 3 |
| NM2 | composition | Ru | Ru | Ru | Ru | Cu |
| | thickness | 0.85 | 1.2 | 0.8 | 0.9 | 0.8 |
| FM2 (2) | composition | CoFe | CoFe | CoFe | CoFe | CoFe |
| | thickness | 2.5 | 3 | 3.5 | 3.5 | 3 |
| AFM2 | composition | PtMn | IrMn | IrMn | IrMn | IrMn |
| | thickness | 7 | 7 | 12 | 12 | 7 |
| CAP | composition | Ta/Ru | Cu | Ru | Cu | Ag |
| | thickness | 5/5 | 20 | 10 | 20 | 5 |

(Thicknesses are measured in nano meters unless otherwise indicated.)

Examples 16~20

Examples 16~20 are made according to the method with which the example 1 is made. What the examples 16~20 differ from the example 1 is that the magnetic nano-multilayers of the former is of the structure D, i.e. SUB/SL/AFM1/FM1/Space/FM2(1)/NM/FM2(2)/AFM2/CAP, as shown in FIG. 6. The composition and the thickness of each layer are shown in table 4.

TABLE 4

| Example # | | 16 | 17 | 18 | 19 | 20 |
|---|---|---|---|---|---|---|
| SUB | composition | Si—$SiO_2$ | Si—$SiO_2$ | Si—$SiO_2$ | Si—$SiO_2$ | Si—$SiO_2$ |
| | thickness | 1 mm | 1 mm | 1 mm | 1 mm | 1 mm |
| SL | composition | Ta/Ru/Ta | Ru | Ru/Cu/Ru | Ta | Ta/Ru/Ta |
| | thickness | 5/20/5 | 5 | 5/20/5 | 30 | 5/20/5 |
| AFM1 | composition | PtMn | IrMn | PtMn | PtMn | IrMn |
| | thickness | 15 | 15 | 15 | 15 | 15 |
| FM1 | composition | CoFe | Co | CoFeB | CoFe | Co |
| | thickness | 3 | 10 | 20 | 4 | 2.5 |
| Space | composition | Cu | Cu | MgO | $AlO_x$ | MgZnO |
| | thickness | 2.8 nm | 2.0 nm | 1.5 nm | 1.0 nm | 2.0 nm |
| FM2 (1) | composition | GaMnAs | GaMnN | CoMnSi | $La_{0.5}Ca_{0.5}MO_3$ | CoFeB |
| | thickness | 4.0 nm | 3 | 2.0 nm | 50 nm | 3 |
| NM2 | composition | Ru | Ru | Ru | Ru | Cu |
| | thickness | 0.85 | 1.2 | 0.8 | 0.9 | 0.8 |
| FM2 (2) | composition | CoFe | CoFe | CoFe | CoFe | CoFe |
| | thickness | 2.5 | 3 | 3.5 | 3.5 | 3 |
| AFM2 | composition | PtMn | IrMn | IrMn | IrMn | IrMn |
| | thickness | 7 | 7 | 12 | 12 | 7 |
| CAP | composition | Ta/Ru | Cu | Ru | Cu | Ag |
| | thickness | 5/5 | 20 | 10 | 20 | 5 |

(Thicknesses are measured in nano meters unless otherwise indicated.)

Examples 21~26

FIG. 7 shows the examples 21 through 26 applying the structure E: SUB/SL/AFM1/FM1/Space/FM2/NM/AFM2/CAP. Example 21 illustrates the method in which the magnetic nano-multilayers of structure E are made. The steps include:

1) Providing a substrate (SUB), the Si—$SiO_2$ with a thickness of 1 mm. Also, depositing a seed layer Ta (5 nm)/Ru (20 nm)/Ta (5 nm) on the substrate with a magnetron sputtering deposition device under the following conditions: a vacuum better than $2\times10^{-6}$ Pa, a deposition rate of 0.1 nm/s and an argon gas pressure of 0.07 Pa during deposition.

2) Depositing on the seed layer (SL) a layer of IrMn with the thickness of 15 nm, which is the first antiferromagnetic layer (AFM1), under the following conditions: a vacuum better than $2\times10^{-6}$ Pa, a deposition rate of 0.1 nm/s and an argon gas pressure of 0.07 Pa.

3) Depositing on the AFM1 a layer of CoFeB with the thickness of 2.5 nm, this is the first ferromagnetic layer (FM1), under the following conditions: a vacuum better than $2\times10^{-6}$ Pa, a deposition rate of 0.06 nm/s and an argon gas pressure of 0.07 Pa.

4) Depositing on the FM1 a layer of $AlO_x$ with the thickness of 1.0 nm, this is the space layer, under the following conditions: a vacuum better than $2\times10^{-6}$ Pa, a deposition rate of 0.07 nm/s and an argon gas pressure of 0.07 Pa.

5) Depositing on the space layer a layer of CoFeB with the thickness of 3 nm, which is the FM2 layer, under the following conditions: a vacuum better than $2\times10^{-6}$ Pa a, a deposition rate of 0.06 nm/s and an argon gas pressure of 0.07 Pa.

6) Depositing on the FM2 an ultrathin nonmagnetic metal layer of Ru with the thickness of 0.04 nm, which is the NM layer, under the following conditions: a vacuum better than $2\times10^{-6}$ Pa, a deposition rate of 0.1 nm/s and an argon gas pressure of 0.07 Pa.

7) Depositing on the NM a layer of IrMn with the thickness of 6.5 nm, which is the AFM2 layer, under the following conditions: a vacuum better than $2 \times 10^{-6}$ Pa, a deposition rate of 0.1 nm/s and an argon gas pressure of 0.07 Pa.

8) Depositing on the AFM2 a layer of Ta (5 nm)/Ru (5 nm), which is the cap layer, under the following conditions: a vacuum better than $2 \times 10^{-6}$ Pa, a deposition rate of 0.1 nm/s and an argon gas pressure of 0.07 Pa.

9) Causing the film obtained in step 8) to undergo a vacuum of $2 \times 10^{-4}$ Pa and a magnetic field in the annealing furnace. The magnetic field is aligned to a specific direction of the film. Drop the temperature after it stays for one hour at 265° C.

10) Causing the film obtained in step 9) to undergo a vacuum of $2 \times 10^{-4}$ Pa and a magnetic field in the annealing furnace. The magnetic field in this step is perpendicular to that in step 9 and is aligned to the plan defined by the film. Drop the temperature after it stays for 15 minutes at 200° C. The film thus obtained, whose structure is shown in FIG. 7, is the magnetic nano-multilayers, we need.

The magnetic nano-multilayers are prepared in the form of a solid disk with a diameter of 10 μm after subsequent micro-machining. The magnetic nano-multilayer structure can be used as a core detecting unit for a TMR magnetic sensor.

Figure 8:
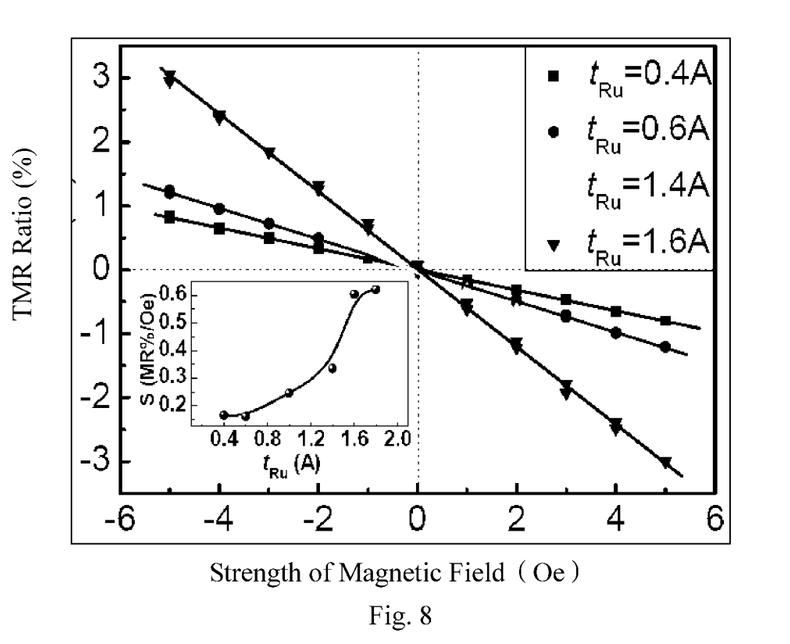
FIG. 8 is a diagram exhibiting the test results of the device resistance and the external magnetic fields (R—H) in accordance with the example 21. The insert shows the relationship between the sensitivity of the magnetic tunnel junction and the thickness of Ru ($t_{Ru}$) thereof Tau.

According the example 1, the present invention provides NM layers with various thicknesses. Instead of a thickness of 0.04 nm, the Ru deposit in step 6) has a thickness of one of 0.06 nm, 0.14 nm and 0.16 nm. FIG. 8 plots the relationships between the device resistance of the magnetic tunnel junction—with various thicknesses of the Ru deposited—and the external magnetic field (R—H). FIG. 8 shows that the magnetic resistance of the Ru deposit-whatever its thickness may be—responds linearly to the external magnetic field. Moreover, the slope of the curves increases as the Ru deposit gets thicker. The insert illustrates the relationship between the sensitivity of the magnetic tunnel junction and the thickness of the Ru deposit ($t_{au}$). The insert shows that thickness of the Ru deposit hugely impacts on the sensitivity.

Table 5 shows the compositions and the thicknesses of the various layers of the magnetic nano-multilayers of examples 22 to 26. The two annealing temperatures are appropriately determined by the Block temperatures in the antiferromagnetic layer of the magnetic reference layer and in that of the magnetic detecting layer.

It is to note that, for all structures, no particular temperature is required for the subsequent annealing processes if the magnetic moment of the magnetic reference layer gets perpendicular to that of the magnetic reference layer when the film develops amidst the step 1) through the step 8). In other words, if we apply the direct pinning structure to the magnetic reference layer and to the magnetic detecting layer, any person with ordinary skills in the art is in a position to deposit a magnetic nano-multilayers structure, in which the magnetic moment of the magnetic detecting layer is perpendicular to that of the magnetic reference layer during the manufacturing process of the film—and the purpose of the invention is also served.

In the context of a pinning structure, the direction of the magnetic moment of the ferromagnetic layer is controlled by the pinning direction of the antiferromagnetic layer. Moreover, the pinning direction of the antiferromagnetic layer is controllable by the external magnetic field when the film develops or by the magnetic field imposed during the subsequent annealing processes. Thus, the magnetic nano-multilayers of the invention provide a device, not only whose magnetoresistance responds linearly to the external magnetic field but also whose linear scope and sensitivity are controllable.

The annealing temperatures under a magnetic field specified in the contexts of the aforementioned embodiments are merely exemplary. $T_B1$ and $T_B2$ denote the Block temperatures of the antiferromagnetic layers of the pinning magnetic reference layer and the magnetic detecting layer, respectively. The temperature requirements of the two annealing processes under a magnetic field are: $T_1 > T_{B1}$, wherein $T_1$ denotes the temperature for first annealing process; $T_{B1} > T_2 > T_{B2}$, wherein $T_2$ denotes the temperature for second annealing process, and the magnetic fields for both annealing are perpendicular to each other. People with ordinary skills in the art can determine the proper temperatures for the two annealing involved in the various embodiments aforementioned by selecting the proper materials. When the magnetic moments of both magnetic layers get perpendicular to each other, we can obtain a magnetic sensor base on a linear response due to either GMR effect or TMR effect. In other embodiments of the invention where the magnetic nano-multilayers can be nano-machined or micro-machined, the file takes various dimensions from a few tens of nanometers to a few tens of micrometers. Also, the film takes a

TABLE 5

| Example # | | 22 | 23 | 24 | 25 | 26 |
|---|---|---|---|---|---|---|
| SUB | composition | Si—SiO$_2$ | Si—SiO$_2$ | Si—SiO$_2$ | Si—SiO$_2$ | Si—SiO$_2$ |
|  | thickness | 1 mm | 1 mm | 1 mm | 1 mm | 1 mm |
| SL | composition | Ta/Ru/Ta | Ru | Ru/Cu/Ru | Ta | Ta/Ru/Ta |
|  | thickness | 5/20/5 | 5 | 10/30/10 | 30 | 5/20/5 |
| AFM1 | composition | PtMn | IrMn | PtMn | CoO | CoFe |
|  | thickness | 5 | 15 | 30 | 10 | 15 |
| FM1 | composition | CoFe | Co | CoFeB | CoFe | Co |
|  | thickness | 3 | 3 | 3 | 4 | 2.5 |
| Space | composition | Cu | Cu | MgO | AlO$_x$ | MgZnO |
|  | thickness | 5.0 nm | 2.0 nm | 1.5 nm | 0.5 nm | 5.0 nm |
| FM2 | composition | CoFe | Co | CoFeB | CoFe | CoFeB |
|  | composition | 4.0 nm | 3 | 4.0 nm | 4.0 nm | 3 |
| NM2 | composition | Ru | Ta | Cr | Ru | Cu |
|  | thickness | 0.85 | 5 | 3 | 0.9 | 0.8 |
| AFM2 | composition | PtMn | IrMn | IrMn | CoO | CoFe |
|  | thickness | 7 | 7 | 12 | 5 | 7 |
| CAP | composition | Ta/Ru | Cu | Ru | Cu | Ag |
|  | thickness | 5/5 | 40 | 10 | 20 | 2 |

(Thicknesses are measured in nano meters unless otherwise indicated.)

variety of shapes such as a hollow or solid eclipse with a radius ratio of from 1:1 through 1:3, a rectangle with an aspect ratio of from 1:1 through 1:3 and a regular polygon (number of sides N=4, 6, 8, 10, 12, 16, 20, 24). Preferably, the film takes the shape of a solid circle or of a solid square.

People with ordinary skills in the art should realize that the magnetron sputtering deposition applied in the embodiments aforementioned is illustrative. Other techniques known in the art such as plasma chemical vapor deposition, low pressure chemical vapor deposition can be applied to make the multilayer film. Also, the deposition rate, the vacuum level, the annealing temperature and the duration mentioned in the embodiments are merely illustrative and are not meant to exclude other combinations.

In one embodiment of the invention, a magnetic sensor based on GMR or TMR effects is provided. The magnetic sensor includes a magnetic resistor unit and a magnetic field under detection. The magnetic resistor unit includes a magnetic nano-multilayers structure. The magnetic nano-multilayers includes, from the bottom to the top: a substrate, a bottom layer, a magnetic reference layer, a space layer, a magnetic detecting layer and a cap layer. The up-stated structure is used for converting the information regarding the rotation of the magnetic moment of the magnetic detecting layer into electrical signals. The magnetic detecting layer is of a pinning structure for detecting the magnetic field under detection. When the magnetic field under detection is zero, the magnetic moment of the magnetic reference layer is perpendicular to that of the magnetic detection layer. In this embodiment, the structures and the materials of the magnetic nano-multilayers can be any of the combinations mentioned above.

In the invention, different Block temperatures are produced by either antiferromagnetic layers of different types or antiferromagnetic layers of the same type but with different thicknesses. Moreover, two subsequent annealing under a magnetic field are applied. Next, when the external magnetic field gets zero, the magnetic moment of the magnetic reference layer is perpendicular to that of the magnetic detecting layer. Finally, we obtained a magnetic sensor with a linear response due to the GMR/TMR effect. Additionally, an intervening layer, whose thickness is adjustable, is placed between the ferromagnetic layer and the antiferromagnetic layer. The intervening layer enables the control of the indirect strength of exchange-bias between the FM/NM/AFM or between the FM1(1)/NM/FM1(2)/AFM, also the control of the functional scope and the sensitivity of the linear magnetoresistance devices. In order to produce a linear magnetoresistance effect, a permanent magnetic thin film have to be embedded in a magnetic head, this results in a complexity of the manufacturing. The invention overcomes the complexity issue that plagues the techniques in the prior art.

The magnetic nano-multilayers in the invention is extremely sensitive because the material the invention uses generates strong magnetoresistance signals. For example, the GMR ratio goes up to 20% under room temperature in the spin value structure of a GMR device whose magnetic electrode is CoFeB (see M. Li, et al., *Digest Int. Symp. Magn. Mat. Proc. Devices,* 2002); the TMR ratio goes up to 80% under room temperature in the $AlO_x$ magnetic tunnel junction in a TMR device whose electrode is CoFeB (see H. X. Wei, X. F. Han et al., *J. Appl. Phys.* 101 (2007) 09B501); the TMR goes further up to 600% in a magnetic tunnel junction whose barrier is MgO (S. Ikeda, H. Ohno et al., *Appl. Phys. Lett.* 93 (2008) 082508). The magnetic nano-multilayers of the present invention has a variety of applications, for example: memory industry, displacement sensor, velocity sensor and angular velocity sensor for the machinery industry, current sensor, earth magnetic field sensor, magnetoencephalography (MEG) sensor, magnetocardiograph (MC) for medical use, and non-destructive detection industry such as probe for leakage detection based on magnetic flux.

The embodiments described above are meant to illustrate the invention and not to restrict the scope of the invention. People with ordinary skills in the art should understand that modifications or improvements can be made to the disclosures in keeping with the gist of the invention. All such modifications and improvements fall within the scope of the invention.

What is claimed:

1. A structure of magnetic nano-multilayers for magnetic sensors, the structure comprising, in sequence from bottom:
    a substrate;
    a bottom layer;
    a magnetic reference layer;
    a space layer;
    a magnetic detecting layer; and
    a cap layer,
    wherein the structure is configured to convert information about the rotation of a magnetic moment of the magnetic detecting layer into an electrical signal; wherein the magnetic reference layer is of a direct or indirect pinning structure, and wherein the magnetic detecting layer is of an indirect pinning structure configured to detect a magnetic field.

2. The structure of magnetic nano-multilayers according to claim 1, wherein the indirect pinning structure of said magnetic reference layer or said magnetic detecting layer comprises:
    an antiferromagnetic layer (AFM)/a nonmagnetic layer (NM)/a ferromagnetic layer (FM); or
    an antiferromagnetic layer (AFM)/a first nonmagnetic metallic layer (NM1)/a first ferromagnetic layer (FM1)/a second nonmagnetic metallic layer (NM2)/a second ferromagnetic layer (FM2).

3. The structure of magnetic nano-multilayers according to claim 1, wherein the direct pinning structure comprises an antiferromagnetic layer (AFM)/a ferromagnetic layer (FM); or an antiferromagnetic layer (AFM)/a first ferromagnetic layer (FM1)/a nonmagnetic layer (NM)/a second ferromagnetic layer (FM2).

4. The structure of magnetic nano-multilayers according to claim 1, wherein a strength of exchange-bias in an antiferromagnetic layer of the magnetic detecting layer is less than that of an antiferromagnetic layer of the magnetic reference layer.

5. The structure of magnetic nano-multilayers according to claim 4, wherein the Block temperature in the antiferromagnetic layer of the magnetic detecting layer is less than that of the antiferromagnetic layer of the magnetic reference layer when the magnetic detection layer and magnetic reference layer are of the indirect pinning structure.

6. The structure of magnetic nano-multilayers according to claim 1, wherein an antiferromagnetic layer in the magnetic detecting layer and the magnetic reference layer are made of different antiferromagnetic materials or a same antiferromagnetic material but of different thicknesses.

7. The structure of magnetic nano-multilayers according to claim 6, wherein the antiferromagnetic material includes one of antiferromagnetic alloy or antiferromagnetic oxide.

8. The structure of magnetic nano-multilayers according to claim 7, wherein:

the antiferromagnetic alloy is selected from the group consisting of of Pt—Mn, Ir—Mn, Co—Cr—Mn, Fe—Mn and Ni—Mn and has a thickness of from 3 to 30 nm, and the antiferromagnetic oxide is selected from the group consisting of CoO and NiO and has a thickness from 5 to 50 nm.

9. The structure of magnetic nano-multilayers according to claim 1, wherein a nonmagnetic metallic layer in the magnetic detecting layer and in the magnetic reference layer is one of Cu, Cr, V, Nb, Mo, Ru, Pd, Ta, W, Pt, Ag, Au and an alloy of such metals and has a thickness from 0 to 5 nm.

10. The structure of magnetic nano-multilayers according to claim 1, wherein:

a ferromagnetic layer (FM), a first ferromagnetic layer (FM1) and a second ferromagnetic layer (FM2) are made of:

one of ferromagnetic metals or an alloy of ferromagnetic metals and have a thickness from 1 to 20 nm; and one of diluted magnetic semiconductors and semi-metallic materials and have a thickness from 2.0 to 50 nm; and the ferromagnetic layer is a single layer film or a composite film made of multilayer films.

11. The structure of magnetic nano-multilayers according to claim 1, wherein the space layer comprises one of a nonmagnetic metallic layer and an insulating barrier layer.

12. The structure of magnetic nano-multilayers according to claim 11, wherein the nonmagnetic metallic layer is selected from the group consisting of Cu, Cr, V, Nb, Mo, Ru, Pd, Ta, W, Pt, Ag, Au and an alloy of such metals and has a thickness from 1 to 5 nm.

13. The structure of magnetic nano-multilayers according to claim 11, wherein the insulating barrier layer is selected from the group consisting of $AlO_x$, MgO, MgZnO, AN, $Ta_2O_5$, ZnO, $HfO_2$, $TiO_2$, $Alq_3$, organic LB hybridized film, GaAs, AlGaAs and InAs and generally has a thickness from 0.5 to 5 nm.

14. The structure of magnetic nano-multilayers according to claim 1, wherein the bottom layer is selected from the group consisting of a single layer nonmagnetic metallic film and a multilayer nonmagnetic metallic film and has a thickness from 3 to 50 nm.

15. The structure of magnetic nano-multilayers according to claim 1, wherein the cap layer is selected from the group consisting of a single-layer metallic film and a multilayer metallic film and has a thickness from 2 to 40 nm.

16. A method of making a structure of magnetic nano-multilayers according to claim 1, comprising the steps of:

providing a substrate;

forming a multilayer on the substrate, the multilayer comprising, in sequence from bottom: a bottom layer, a magnetic reference layer, a space layer, a magnetic detecting layer, a magnetic detecting layer, and a cap layer;

subjecting the multilayer deposit to a first vacuum annealing in a first magnetic field; and subjecting the multilayer deposit to a second vacuum annealing in a second magnetic field, wherein:

the temperature of the first vacuum annealing is greater than the Block temperature $T_B1$ in an antiferromagnetic layer of the magnetic reference layer;

the temperature of the second vacuum annealing is less than the Block temperature $T_B1$ in the antiferromagnetic layer of the magnetic reference layer and greater than the Block temperature $T_B2$ in the antiferromagnetic layer of the magnetic detecting layer; and the direction of the magnetic field of the first annealing is perpendicular to that of the magnetic field of second vacuum annealing.

17. A method in claim 16, wherein the magnetic reference layer is formed by one of the steps of:

depositing an antiferromagnetic layer, a first ferromagnetic layer on top of the antiferromagnetic layer, a nonmagnetic metallic layer on top of the first ferromagnetic layer and a second ferromagnetic layer on top of the nonmagnetic metallic layer; and depositing an antiferromagnetic layer, a nonmagnetic metallic layer on top of the antiferromagnetic layer, and a ferromagnetic layer on top of the nonmagnetic metallic layer.

18. A magnetic sensor, comprising:

a magnetic field under detection; and a magnetic resistor unit including a structure of magnetic nano-multilayers according to claim 1, wherein the direction of the magnetic moment of the magnetic reference layer is perpendicular to that of the magnetic moment of the magnetic detecting layer when the magnetic field under detection is zero.

19. The magnetic sensor according to claim 18, wherein, when external magnetic field is zero the direction of the magnetic moment of the magnetic reference layer is parallel to that of the magnetic field under detection; and the direction of the magnetic moment of the magnetic detecting layer is perpendicular to that of the magnetic field under detection.

20. The magnetic sensor according to claim 19, wherein said indirect pinning structure of said magnetic reference layer or said magnetic detecting layer comprises one of:

an antiferromagnetic layer (AFM)/a nonmagnetic metallic layer (NM)/a ferromagnetic layer (FM); and an antiferromagnetic layer (AFM)/a first nonmagnetic metallic layer (NM1)/a first ferromagnetic layer (FM1)/a second nonmagnetic metallic layer (NM2)/a second ferromagnetic layer (FM2).

21. The magnetic sensor according to claim 20, wherein said direct pinning structure comprising an antiferromagnetic layer (AFM)/a ferromagnetic layer (FM), or an antiferromagnetic layer (AFM)/a first ferromagnetic layer (FM1)/a nonmagnetic metallic layer (NM)/and a second ferromagnetic layer (FM2).

22. The magnetic sensor according to claim 20, wherein a strength of exchange-bias in the antiferromagnetic layer of the magnetic detecting layer is less than that of the antiferromagnetic layer of the magnetic reference layer.

23. The magnetic sensor according to claim 22, wherein the block temperature in the antiferromagnetic layer of the magnetic detecting layer is less than that of the antiferromagnetic layer of the magnetic reference layer when the magnetic detecting layer and magnetic reference layer are of the indirect pinning structure.

24. The structure of magnetic nano-multilayers according to claim 10, wherein:

the ferromagnetic metal is selected from the group consisting of Co, Fe and Ni;

the alloy of ferromagnetic metals is selected from the group consisting of Co—Fe, Co—Fe—B, NiFeCr and Ni—Fe;

the diluted magnetic semiconductor is selected from the group consisting of GaMnAs and Ga—Mn—N; and
the semi-metallic material is selected from the group consisting of Co—Mn—Si, Co—Fe—Al, Co—Fe—Si, Co—Mn—Al, Co—Fe—Al—Si, Co—Mn—Ge, Co—Mn—Ga, Co—Mn—Ge—Ga, La1-xSr$_x$MnO$_3$ and La1-xCa$_x$MnO$_3$, where 0<X<1.

* * * * *